United States Patent
Bakir et al.

(10) Patent No.: US 7,132,736 B2
(45) Date of Patent: Nov. 7, 2006

(54) DEVICES HAVING COMPLIANT WAFER-LEVEL PACKAGES WITH PILLARS AND METHODS OF FABRICATION

(75) Inventors: Muhannad S. Bakir, Atlanta, GA (US); James D. Meindl, Marietta, GA (US); Chirag S. Patel, College Park, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 10/285,034

(22) Filed: Oct. 31, 2002

(65) Prior Publication Data

US 2003/0122229 A1    Jul. 3, 2003

Related U.S. Application Data

(60) Provisional application No. 60/335,808, filed on Oct. 31, 2001.

(51) Int. Cl.
*H01L 29/40* (2006.01)
*H01L 23/02* (2006.01)
*H01L 23/48* (2006.01)

(52) U.S. Cl. .............. 257/678; 257/621; 257/696; 257/773; 257/667; 257/798; 257/777; 257/784; 257/786; 257/783; 257/776; 257/775; 361/776; 361/774; 361/784; 361/773; 174/262; 174/260; 174/250; 385/14

(58) Field of Classification Search ................ 257/684, 257/722, 723, 724, 758, 736, 752, 698, 692, 257/678, 621, 696, 773, 667, 666, 784, 786, 257/783, 776, 775; 361/776, 774, 784, 773; 174/262, 260, 250; 385/14
See application file for complete search history.

(56) References Cited

U.S. PATENT DOCUMENTS 4,380,365 A    4/1983  Gross ..................... 350/96.18
4,486,945 A *  12/1984 Aigoo ........................ 438/123
4,740,700 A *  4/1988  Shaham et al. ............. 250/332
4,821,148 A *  4/1989  Kobayashi et al. ......... 361/728
4,902,556 A *  2/1990  Benedikt et al. ............ 428/209
4,910,077 A *  3/1990  Benedikt .................... 442/232
5,045,151 A *  9/1991  Edell .......................... 257/622
5,046,800 A    9/1991  Blyler, Jr. et al. .......... 385/131
5,047,644 A *  9/1991  Meissner et al. ........... 250/332
5,073,814 A *  12/1991 Cole et al. .................. 257/643
5,130,356 A    7/1992  Feuerherd et al. ........... 524/96
5,264,326 A *  11/1993 Meissner et al. ........... 430/313
5,302,656 A    4/1994  Kohara et al. .............. 524/579
5,359,208 A    10/1994 Katsuki et al. ............... 257/82

(Continued)

OTHER PUBLICATIONS

Schröder, et al.; Polymer Optical Interconnects for PCB; 2001; Session 13: Photonic Polymers II; pp. 337-343.

(Continued)

*Primary Examiner*—Alexander Oscar Williams
(74) *Attorney, Agent, or Firm*—Thomas, Kayden, Horstemeyer & Risley, LLP (57) ABSTRACT

Devices and methods of fabrication thereof are disclosed. A representative device includes a complaint wafer-level package having one or more lead packages. A representative lead package includes a substrate having a plurality of die pads disposed thereon and a plurality of leads attached to the plurality of die pads. In addition, the lead package includes a plurality of pillars made of a low modulus material. Each pillar is disposed between the substrate and at least one lead, and each lead is disposed upon one of the pillars that compliantly support the lead.

6 Claims, 8 Drawing Sheets

U.S. PATENT DOCUMENTS

| | | | | |
|---|---|---|---|---|
| 5,434,196 | A | | 7/1995 | Ohkawa et al. .............. 522/100 |
| 5,434,751 | A | * | 7/1995 | Cole et al. ................... 361/792 |
| 5,462,995 | A | | 10/1995 | Hosaka et al. ............ 525/332.1 |
| 5,581,414 | A | | 12/1996 | Snyder ....................... 359/819 |
| 5,824,568 | A | * | 10/1998 | Zechman .................... 438/112 |
| 5,896,479 | A | | 4/1999 | Vladic ......................... 385/59 |
| 5,897,326 | A | * | 4/1999 | Eldridge et al. .............. 438/14 |
| 5,983,493 | A | * | 11/1999 | Eldridge et al. .............. 29/855 |
| 6,022,498 | A | | 2/2000 | Buazza et al. ............. 264/1.38 |
| 6,039,897 | A | | 3/2000 | Lochhead et al. ......... 264/1.24 |
| 6,127,724 | A | * | 10/2000 | DiStefano ................... 257/675 |
| 6,156,394 | A | | 12/2000 | Schultz Yamasaki et al. .... 427/536 |
| 6,206,673 | B1 | | 3/2001 | Lipscomb et al. ........ 425/174.4 |
| 6,253,004 | B1 | | 6/2001 | Lee et al. ..................... 385/31 |
| 6,259,567 | B1 | | 7/2001 | Brown et al. ............... 359/668 |
| 6,262,414 | B1 | | 7/2001 | Mitsuhashi ................. 250/216 |
| 6,272,275 | B1 | | 8/2001 | Cortright et al. ........... 385/129 |
| 6,281,508 | B1 | | 8/2001 | Lee et al. ................... 250/396 |
| 6,432,328 | B1 | | 8/2002 | Hamanaka et al. ........ 264/1.36 |
| 6,452,406 | B1 | * | 9/2002 | Beaman et al. ............. 324/754 |
| 6,500,603 | B1 | | 12/2002 | Shioda ....................... 430/321 |
| 6,525,551 | B1 | * | 2/2003 | Beaman et al. ............. 324/754 |
| 6,757,181 | B1 | * | 6/2004 | Villanueva et al. ......... 361/816 |
| 6,764,875 | B1 | * | 7/2004 | Shook ........................ 438/106 |
| 6,778,406 | B1 | * | 8/2004 | Eldridge et al. ............ 361/776 |
| 6,822,340 | B1 | * | 11/2004 | Lamson et al. ............. 257/790 |
| 2001/0055088 | A1 | | 12/2001 | Kume et al. ................ 349/156 |
| 2002/0002624 | A1 | * | 1/2002 | Hausmann et al. ......... 709/246 |
| 2002/0089344 | A1 | * | 7/2002 | Beaman et al. ............. 324/754 |
| 2002/0155728 | A1 | * | 10/2002 | Khandros et al. ........... 438/773 |
| 2002/0190738 | A1 | * | 12/2002 | Beaman et al. ............. 324/754 |
| 2003/0119221 | A1 | * | 6/2003 | Cunningham et al. ........ 438/52 |
| 2003/0214045 | A1 | * | 11/2003 | Lahiri et al. ................ 257/761 |
| 2005/0103097 | A1 | * | 5/2005 | Faltum et al. ............. 73/61.41 |

OTHER PUBLICATIONS

Glukh, et al.; High performance Polymeric Materials for Waveguide Applications; Aug. 2000; SPIE—The International Society for Optical Engineering, inear, Nonlinear, and Power Limiting Organics, San Diego, vol. 4106; pp. 1-11.

Liu, et al.; Plastic VCSEL Array Packaging and High Density Polymer Waveguides for Board and Backplane Optical Interconnect; 1998; Electronic Components and Technology Conference; pp. 999-1005.

Bakir, et al.; Sea of Dual Mode Polymer Pillar I/O Interconnections for Gigascale Integration; 2003; IEEE International Solid State Circuits Conference; 8 pages.

Beuret, et al.; Microfabrication of 3D Multidirectional Inclined Structure by UV lithography and Electroplating; Micro Electro Mechanical Systems, 1994, MEMS'94, Proceedings, IEEE Workshop on Jan. 25-28, 1994; pp. 81-85.

Wang, et al.; Studies on A Novel Flip-Chip Interconnect Structure-Pillar Bump; Electronic Components and Technology Conference, 2001, Proceedings, 51st, May 29-Jun. 1, 2001; pp. 945-949.

Chen, et al.; Fully Embedded Board-Level Guided-Wave Optoelectronic Interconnects; Jun. 2000; Proceedings of IEEE, vol. 88, No. 6; pp. 780-793.

Wiesmann, et al.; Singlemode Polymer Waveguides for Optical Backplanes; Dec. 5, 1996; Electronics Letters, vol. 32, No. 25; pp. 2329-2330.

Barry, et al.; Highly Efficient Coupling Between Single-Mode Fiber and Polymer Optical Waveguides; Aug. 1997; IEEE Transactions on Components, Packaging, and Manufacturing Technology—Part B, vol. 20, No. 3; pp. 225-228.

Lee, et al.; Fabrication of Polymeric Large-Core Waveguides for Optical Interconnects Using a Rubber Molding Process; Jan. 2000; IEEE Photonics Technology Letters, vol. 12, No. 1; pp. 62-64.

Schmeider, et al.; Electro-Optical Printed Circuit Board (EOPCB); 2000 Electronic Components and Technoogy Conference; pp. 749-753.

Mederer, et al.; 3Gb/s Data Transmission With GaAs VCSELs Over PCB Integrated Polymer Waveguides; Sep. 2001; IEEE Photonics Technology Letters, vol. 13, No. 9; pp. 1032-1034.

Bakir, et al.; Sea of Polymer Pillars: Dual-Mode Electrical Optical Input/Output Interconnections; in Proc. of Int. Interconnect Technology Conference; pp. 77-79; 2003.

Bakir, et al.; Sea of Polymer Pillars: Compliant Wafer-Level Electrical-Optical Chip I/O Interconnections; IEEE Photonics Technology Letters, vol. 15, No. 11, Nov. 2003; pp. 1567-1569.

Bakir, et al.; Optical Transmission of Polymer Pillars for Chip I/O Optical Interconnections; IEEE Photonics Technology Letters, vol. 16, No. 1, Jan. 2004; pp. 117-119.

Chandrasekhar, et al.; Modeling and Characterization of the Polymer Stud Grid Array (PSGA) Package: Electrical, Thermal and Thermo-Mechanical Qualfication; IEEE Transcations on Electronics Packaging Manufacturing, vol. 26, No. 1, Jan. 2003; pp. 54-67.

Bakir, et al.; Optical Transmission of Polymer Pillars for Chip I/O Optical Interconnections; IEEE Photonics Techology Letters; vol. 16, No. 1; Jan. 2004; pp. 117-119.

Bakir, et al.; Sea of Polymer Pillars: Compliant Wafer-Level Electrical-Optical Chip I/O Interconnections; IEEE Photonics Techology Letters; vol. 15, No. 11; Nov. 2003; pp. 1567-1569.

Bakir, et al; Sea of Polymer Pillars Electrical and Optical Chip I/O Interconnections for Gigascale Integration; IEEE Transactions on Electron Devices; vol. 51, No. 7; Jul. 2004; pp. 1069-1077.

Bakir, et al.; Integration of Optical Polymer Pillars Chip I/O Interconnections with Si MSM Photodetectors; IEEE Transactions on Electron Devices; vol. 51, No.; 7; Jul. 2004; pp. 1084-1090.

W. Wayt Gibbs; Computing at the Speed of Light; Scientific American; Nov. 2004; pp. 81-87.

John Baliga; Polymer Pillars for Optical and Electrical Signals; Semiconductor International; Dec. 2004; p. 36.

Richard Ball; ISSCC: Polymer Pillars Used to Connnect Die; Electronics Weekly Archive; Feb. 2003.

Ron Wilson; Session Examines Novel Semiconductor Devices; EE Times; Feb. 12, 2003; URL: http://eetimes.com/article/showArticle.jhtml?articleID=18308034.

* cited by examiner

DEVICES HAVING COMPLIANT WAFER-LEVEL PACKAGES WITH PILLARS AND METHODS OF FABRICATION

CROSS-REFERENCE TO RELATED APPLICATION

This application claims priority to copending U.S. provisional application entitled, "A WAFER-LEVEL PACKAGE UTILIZING PILLARS OF VARIABLE MATERIALS TO ENABLE THREE-DIMENSIONAL (X-Y-Z) COMPLIANT LEADS," having Ser. No. 60/335,808, filed Oct. 31, 2001, which is entirely incorporated herein by reference.

STATEMENT REGARDING FEDERALLY SPONSORED RESEARCH OR DEVELOPMENT

The U.S. government has a paid-up license in this invention and the right in limited circumstances to require the patent owner to license others on reasonable terms as provided for by the terms of MDA972-99-1-0002 awarded by the DARPA.

TECHNICAL FIELD

The present invention is generally related to integrated circuits and, more particularly, is related to devices having compliant wafer-level packaging and methods of fabrication thereof.

BACKGROUND OF THE INVENTION

Conventional chip manufacturing is divided into front-end, back-end, and tail-end processing. Front-end of the line (FEOL) processing refers to the fabrication of transistors, while back-end of the line (BEOL) processing describes wafer metallization. Tail-end of the line (TEOL) processing refers to the packaging of the individual dice. Generally, the final wafer-level process step is the fabrication of vias through a passivation layer to expose the die pads, which serve as the interface between the die and the package. Each individual die, while still part of the wafer, is then functionally tested to identify known good die (KGD) followed by wafer singulation. The KGDs are then shipped to a packaging foundry where they are individually placed in a temporary package for burn-in. The dice that pass this test are then individually packaged into their final package and tested again for functionality. This final step concludes tail-end processing and the functional packaged dice are finally ready for system assembly.

The mechanical performance of a package is important for wafer-level testing, protection, and reliability. Wafer-level testing of electrical devices requires simultaneous reliable electrical contact across a surface area. Typically, neither the wafer nor the testing substrate is planar enough to enable this reliable temporary electrical contact. In-plane (i.e., x-y axis) compliance is generally required to account for potential problems such as, for example, thermal expansion between the chip and printed wiring board and probe contact with leads. Wafer-level testing and burn-in demands significant out-of-plane (i.e., z-axis) compliance in order to establish reliable electrical contact between the pads on the non-planar wafer and pads/probes on the board surfaces. Non-compliance of the input/output (I/O) interconnects/pads out-of-plane, as well as in-plane (i.e., x-y axis), can cause difficulties in performing wafer-level testing.

Unlike conventional packaging, wafer-level packaging (WLP) is a continuation of integrated circuit manufacturing. In WLP, additional masking steps can be used after BEOL processing to simultaneously package all dice across the wafer. A unique class of WLP is called compliant wafer-level packaging (CWLP). In CWLP, additional masking steps can be used following BEOL to batch fabricate compliant x-y-z axis I/O leads between the die pads and the board pads. A mechanically x-y-z flexible lead is formed between the die pad and the bump interconnection that would be joined with the board. The compliant lead allows the interconnection of chips to boards with a coefficient of thermal expansion (CTE) mismatch and, as a result, no underfill is needed. In addition, the compliant interconnect allows wafer-level functionality testing as well as wafer-level burn-in to identify known good packaged die (KGPD). WLP allows the semiconductor industry to extend the economic benefits of wafer-level processing to chip I/O interconnection (i.e., cheaper packaging).

The surface area of a WLP is exactly equal to the area of a die, and thus, the net area available for the design/fabrication of x-y-z-compliant leads is predefined. Thus, it is important to develop a lead design that allows very high compliance and high I/O density. The cost, size, weight, and performance of electronic packages significantly influence the overall cost, weight, size, and performance of electronic systems.

Accordingly, there is a need in the industry for x-y-z compliant leads that provide high density, high electrical performance, low cost, and the ability of batch fabrication. Thus, a heretofore unaddressed need exists in the industry to address the aforementioned deficiencies and inadequacies.

SUMMARY OF THE INVENTION

A representative device of the present invention includes a compliant wafer-level package having one or more lead packages. The lead packages include a substrate having a plurality of die pads disposed thereon and a plurality of leads attached to the plurality of die pads. In addition, the lead package includes a plurality of pillars made of a low modulus material. Each pillar is disposed between the substrate and at least one lead, and each lead is disposed upon one of the pillars that compliantly supports the lead.

The present invention also involves method for fabricating a device having the compliant wafer-level package. A representative method includes: providing a substrate having at least one die pad disposed upon the substrate; disposing a low modulus material onto at least one portion of the substrate and the at least one die pad; removing portions of the low modulus material to expose at least one die pad and form at least one pillar of the low modulus material located adjacent to the at least one die pad; and disposing a lead onto the at least one die pad and portions of the pillar adjacent the die pad.

Other systems, methods, features, and advantages of the present invention will be, or become, apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 6A is a cross-sectional view that illustrates another embodiment of the compliant wafer-level package, while

DETAILED DESCRIPTION

Devices of the present invention include compliant wafer-level packages that exhibit exceptional electrical performance (e.g., low resistance, inductance, and capacitance). Consequently, devices having compliant wafer-level packages can preserve signal integrity and minimize ground bounce, cross talk, resistive loses, and heat generation.

The compliant wafer-level package can be incorporated into devices, such as, but not limited to, silicon and non-silicon based solid-state circuits, as well as compound semiconductor devices.

A representative compliant wafer-level package (hereinafter "compliant wafer") includes one or more lead packages. The lead packages incorporate one or more pillars of a low modulus material to enhance lead compliance in-plane and out-of-plane (i.e., x-y axis and z axis directions, respectively) by supporting the lead. The pillars allow the lead to be compliant in the x-y-z directions, which allows the lead packages to be attached to a board with a higher coefficient of thermal expansion without underfill, thus lowering costs and enhancing reliability. The pillars enable ultra high I/O density (e.g., about 10 to about 100,000 leads per centimeter squared ($cm^2$)) to be achieved on the chip at the wafer-level, which can enhance power distribution, increase I/O bandwidth, satisfy three-dimensional structural I/O demands, suppress simultaneous switching noise, improve isolation in mixed signal systems, and decrease costs. In addition, wafer-level functionality testing as well as wafer-level burn-in, which can be used to identify known good packaged die (KGPD), can be enhanced (i.e., reduced time and cost).

Figure 1:
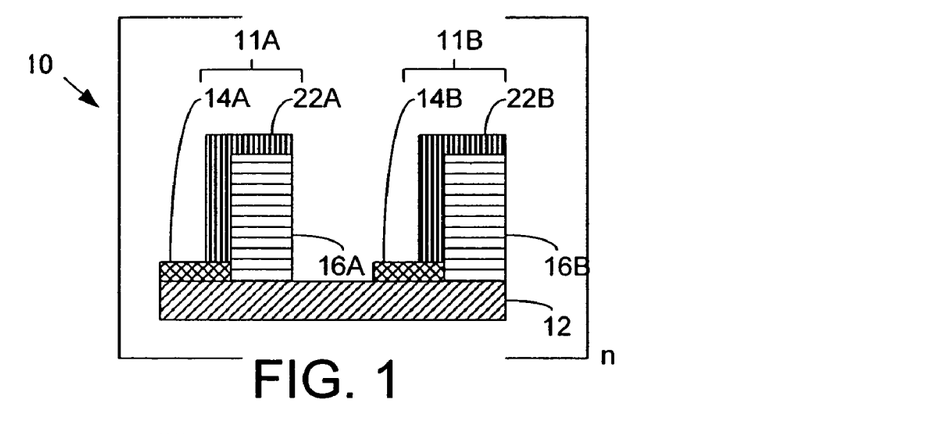
FIG. 1 is a cross-sectional view illustrating a representative embodiment of the compliant wafer-level package of the present invention.

Reference will now be made to the figures. FIG. 1 illustrates a cross-sectional view of a representative embodiment of a compliant wafer 10. The compliant wafer 10 includes two lead packages 11 A and 11 B, however, one or more lead packages can be included on compliant wafers of the present invention. An exemplary compliant wafer 10 can include about 10 to about 100,000 pillars per $cm^2$, about 1000 to about 90,000 pillars per $cm^2$, about 5000 to about 50,000 pillars per $cm^2$, about 7500 to about 25,000 pillars per $cm^2$, and preferably about 10,000 to about 20,000 pillars per $cm^2$. FIG. 1 illustrates that the exemplary compliant wafer 10 can include "n" pillars per $cm^2$, where "n" is 100,000 pillars per $cm^2$, about 1000 to about 90,000 pillars per $cm^2$, about 5000 to about 50,000 pillars per $cm^2$, about 7500 to about 25,000 pillars per $cm^2$, and preferably about 10,000 to about 20,000 pillars per $cm^2$.

The compliant wafer 10 includes a substrate 12 and two lead packages 11A and 11B. The lead packages 11A and 11B include two die pads 14A and 14B, two pillars 16A and 16B, and two leads 22A and 22B, respectively. The die pads 14A and 14B are disposed upon the substrate 12. The pillars 16A and 16B are also disposed upon the substrate 12 and are located adjacent to the die pads 14A and 14B and the leads 22A and 22B, respectively. The leads 22A and 22B are disposed upon the pillars 16A and 16B and the die pads 14A and 14B, respectively.

The geometry of the leads that can be used in embodiments of the present invention is not limited to that shown in FIG. 1. Instead, various lead geometries can provide compliance, consistent with the scope of the present invention. Additional steps can be performed to fabricate an attachment or contact on the end portion of the lead. This contact (not shown) can include a variety of items designed to contact or attach to a pad or point on another substrate. These contacts can be, for example, a solder bump, a conductive adhesive, or a contact probe. The contacts can be formed with methods such as electroplating, electroless plating, screen or stencil printing.

The substrate 12 can be any of a variety of substrates that can be used to support the compliant wafer 10. The substrate 12 can be fabricated from materials such as, but not limited to, silicon, silicon compounds, or other semiconductor materials/compounds. In addition, the substrate 12 can also be fabricated from non-semiconductor substrate materials such as, for example, ceramic or organic boards.

The die pads 14A and 14B can be deposited upon the surface of the substrate 12 using techniques such as, for example, sputtering, evaporation, electron-beam deposition, electroplating, electro-less plating, and displacement reactions.

The pillars 16A and 16B can be made of low modulus materials such as, but not limited to, polyimides, epoxides, polynorbornenes, polyarylene ethers, and parylenes. In particular, the low modulus materials can include compounds such as Amoco Ultradel™ 7501, BF Goodrich Avatrel™ Dielectric Polymer, DuPont™ 2611, DuPont 2734, DuPont 2771, and DuPont 2555. In addition, the pillars 16A and 16B can be fabricated from an electrically conductive material such as a metal (e.g., copper).

Figure 2A:
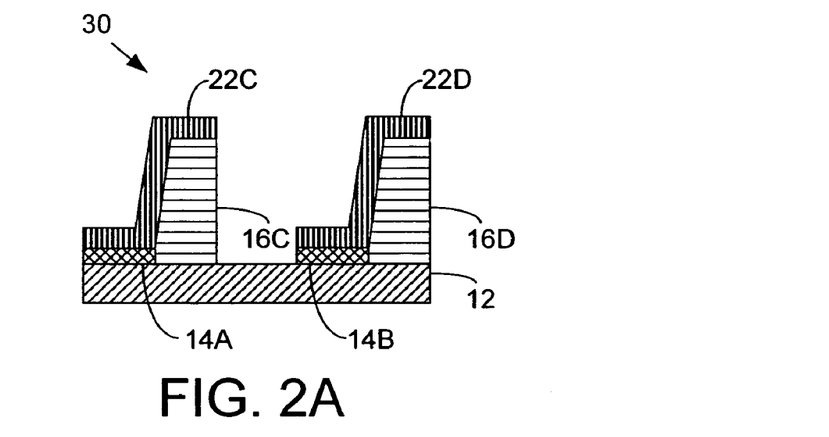
FIGS. 2A and 2B are cross-sectional views that illustrate other representative compliant wafer-level package having different three-dimensional pillar structures than the compliant wafer-level package shown in FIG. 1.
Figure 2B:
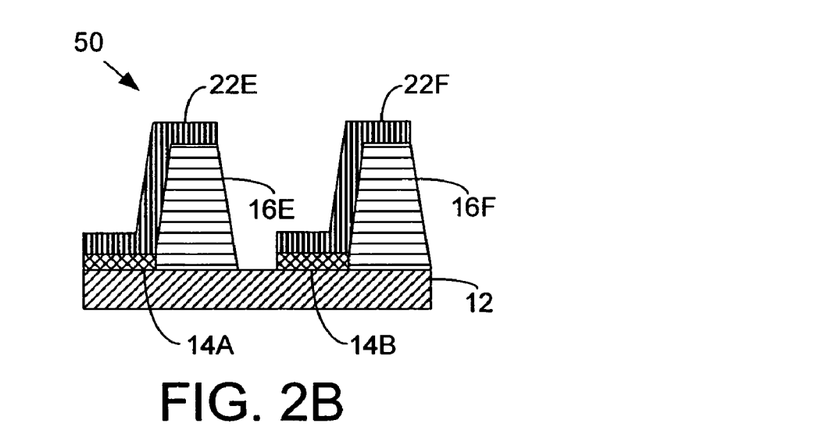

The pillars 16A and 16B depicted in FIG. 1 are rectangular three-dimensional structures; however, the three-dimensional structures that the pillars can be fabricated into are not limited to these shapes. For example, FIGS. 2A and 2B are cross-sectional views of the compliant wafers 30 and 50 that depict two pairs of pillars 16C and 16D, and 16E and 16F having alternative three-dimensional structures to that shown in FIG. 1. In addition, the lateral cross-sectional shape of three-dimensional structures that the pillars can take the form of include, but are not limited to, polyhedral, circular, elliptical, L-shaped, plus sign-shaped, doughnut shaped, and modifications (e.g., tapered) or combinations thereof. The three-dimensional structures provide support for the lead and are flexible in the x-y-z directions. The type, size, and shape of the three-dimensional structures determine the compliancy of the lead. Therefore, the amount of compliance can, in part, be controlled by selecting the type, size, and shape of the three-dimensional structure. In addition, two pairs of leads 22C and 22D, and 22E and 22F, can be fabricated into shapes complementary to their respective pillars 16C and 16D, and 16E and 16F.

In another embodiment, the pillars 16A and 16B can be coated with a metal (e.g., copper). Subsequently, the pillars 16A and 16B can be removed so that a hollow structure is formed.

The pillars 16A and 16B can have a height from about 10 to about 300 micrometers, width of about 2 to about 100 micrometers, and length of about 2 to about 100 micrometers. Preferably, the pillars 16A and 16B can have a height from about 30 to about 150 micrometers, width of about 5 to about 10 micrometers, and length of about 5 to about 10 micrometers.

The leads 22A and 22B can be fabricated of one or more layers of metals, metal composites, organic conductors, or combinations thereof, appropriate for the compliant wafer 10. The metals and metal composites include, but are not limited to, gold, gold alloys, copper, and copper alloys. The leads 22A and 22B can be fabricated by monolithically electroplating the selected metal or metal composite onto the compliant wafer 10.

The leads 22A and 22B can have a thickness that ranges from about 1 to about 100 micrometers, and preferably from about 0.5 to about 10 micrometers. The preferred embodiment of the leads 22A and 22B has a thickness of about 2 micrometers. The leads 22A and 22B can have lengths that range from about 2 and about 300 micrometers, and preferably from about 30 to about 150 micrometers. The leads 22A and 22B can have a width that ranges from about 1 to about 100 micrometers, and preferably from about 2 to about 40 micrometers. The leads 22A and 22B can have a height that ranges from about 10 to about 300 micrometers, and preferably from about 30 to about 150 micrometers.

For the purposes of illustration only, and without limitation, embodiments of the present invention will be described with particular reference to the below-described fabrication methods. Note that not every step in the process is described with reference to the process described in the figures hereinafter. For example, photolithography, or similar techniques, can be used to define the lead pattern. In this regard, the pattern can be defined by depositing sacrificial material (e.g., photoresist) using techniques such as, for example, spin-coating, doctor-blading, or plasma based deposition. Furthermore, the pattern can then be exposed to light and developed. Therefore, the following fabrication processes is not intended to be an exhaustive list that includes every step required to fabricate the embodiments of the compliant wafer devices.

Figure 3A:
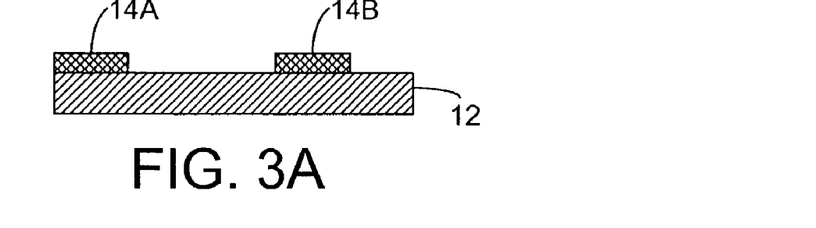
FIGS. 3A through 3G are cross-sectional views that illustrate a representative process of fabricating the compliant wafer-level package shown in FIG. 1.
Figure 3B:
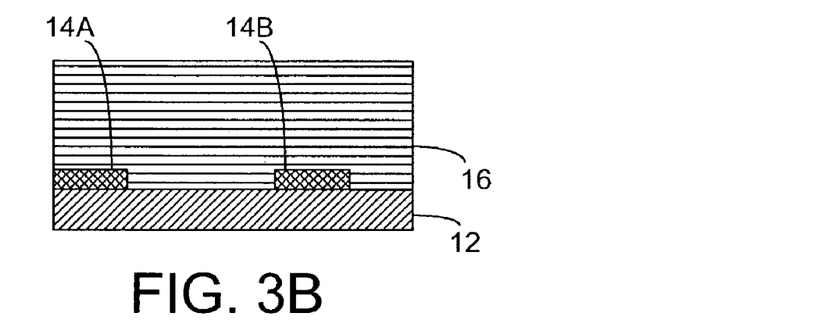

FIGS. 3A through 3G are cross-sectional views that illustrate a representative process for fabricating two lead packages 11A and 11B for the compliant wafer 10 illustrated in FIG. 1. FIG. 3A illustrates the substrate 12 having two die pads 14A and 14B disposed upon the substrate 12. FIG. 3B illustrates a low modulus material layer 16 disposed upon the substrate 12 and the die pads 14A and 14B. The low modulus material can be deposited on the substrate 12 and the die pads 14A and 14B by methods such as, for example, spin-coating, doctor-blading, and plasma deposition.

Figure 3C:
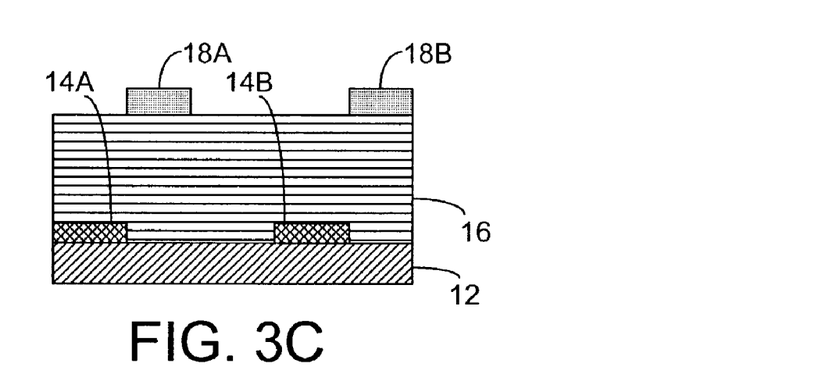

FIG. 3C illustrates the addition of the mask 18A and 18B disposed upon the modulus material layer 16, but not directly over the die pads 14A and 14B. The hard mask 18A and 18B can be made of material such as, but not limited to, any material that is selective to polymer etching, such as metals and silicone dioxide. Alternatively, no hard mask is necessary when the pillars are photodefined.

Figure 3D:
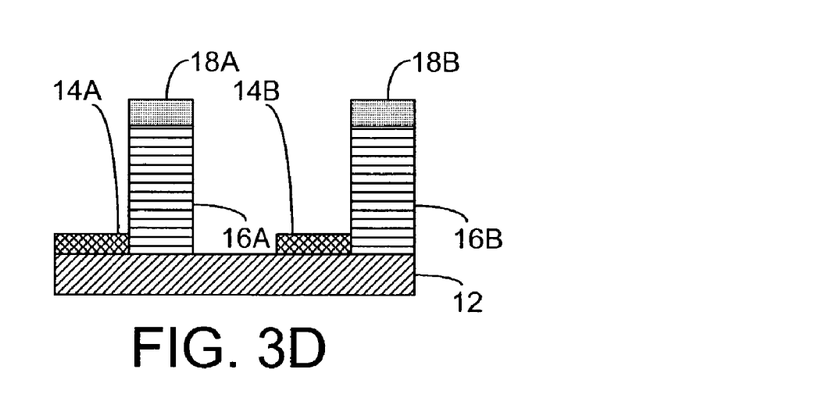

FIG. 3D illustrates the etching of the modulus material layer 16, which forms the pillars 16A and 16B. The modulus material layer 16 can also be formed using techniques such as, for example, reactive ion etching (RIE), photo-definition, and laser drilling.

Figure 3E:
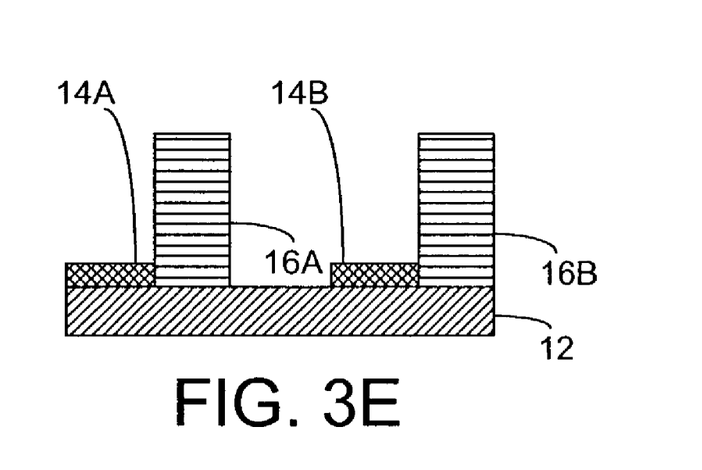
Figure 3F:
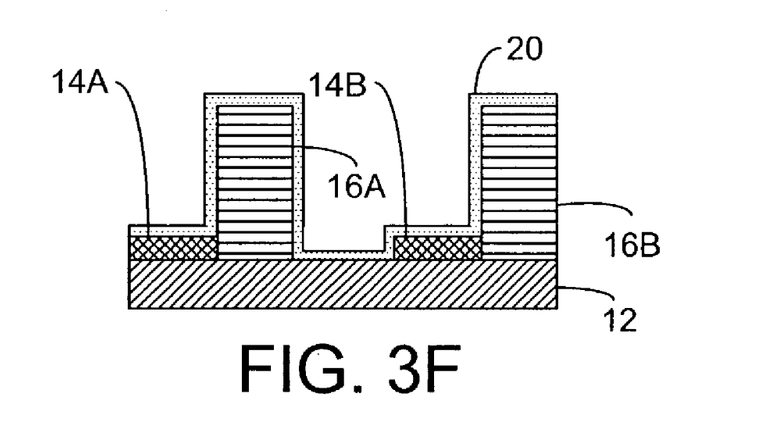

FIG. 3E illustrates the removal of the mask 18A and 18B. FIG. 3F illustrates the disposition of the seed layer 20 onto the die pads 14A and 14B, and the pillars 16A and 16B. The seed layer 20 can be deposited using techniques such as, for example, sputtering, evaporating, electron-beam deposition, and electroless plating.

Figure 3G:
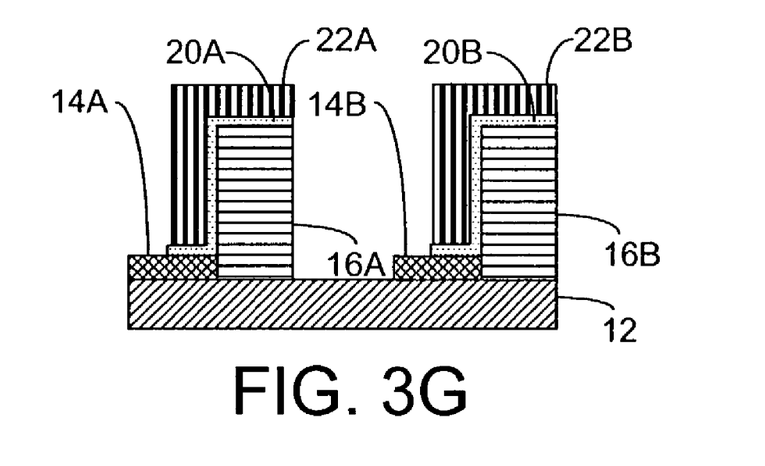

FIG. 3G illustrates the deposition of the leads 22A and 22B onto the seed layers 20A and 20B before the seed layer 20 has been etched. The leads 22A and 22B can be deposited by the techniques referred to above. It should be noted that to simplify FIG. 1, seed layers are not shown. For thin metal leads (<2 μm), the leads 22A and 22B can be used as the final leads. For thick metal leads, the leads 22A and 22B are plated on the seed layers. In addition, in another embodiment, the metal leads can be fabricated on the entire outer surface of the pillar and not just a portion of the pillar, as shown in the FIG. 3G.

Figure 4:
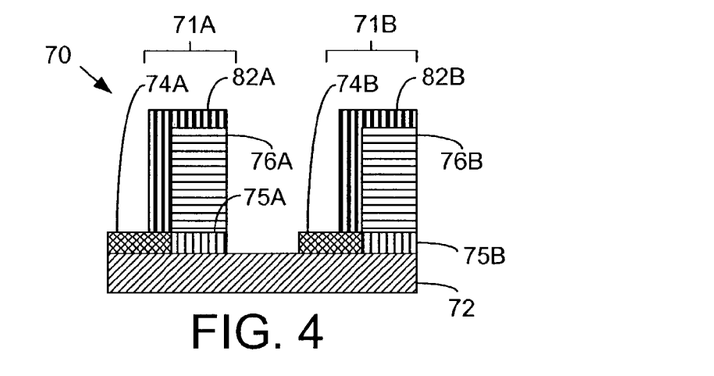
FIG. 4 is a cross-sectional view that illustrates another embodiment of the compliant wafer-level package.

FIG. 4 illustrates a cross-sectional view of a representative embodiment of the compliant wafer 70. The compliant wafer 70 includes the two lead packages 71A and 71B having the two pillars 76A and 76B, respectively. However, one or more lead packages (i.e., pillars) can be included on a compliant wafer. An exemplary compliant wafer 70 can include about 10 to about 100,000 pillars per $cm^2$, about 1000 to about 90,000 pillars per $cm^2$, about 5000 to about 50,000 pillars per $cm^2$, about 7500 to about 25,000 pillars per $cm^2$, and preferably about 10,000 to about 20,000 pillars per $cm^2$.

The compliant wafer 70 includes the substrate 72 and two lead packages 71A and 71B. Each lead package 71A and 71B includes two die pads 74A and 74B, two polymer layers or structures 75A and 75B, two pillars 76A and 76B, and two leads 82A and 82B, respectively. The die pads 74A and 74B are disposed upon the substrate 72. The polymer layers 75A and 75B are disposed on the substrate 72. The pillars 76A and 76B are also disposed upon the polymer layers 75A and 75B and are located adjacent to the die pads 74A and 74B and the leads 82A and 82B, respectively. The leads 82A and 82B are disposed upon the pillars 76A and 76B and the die pads 74A and 74B, respectively.

The substrate 72, the die pads 74A and 74B, and the leads 82A and 82B correspond to the substrate 12, the die pads 14A and 14B, and the leads 22A and 22B described in FIG. 1 and will not be discussed in any additional detail.

The polymer layers 75A and 75B have elastic properties that enable the leads 82A and 82B to be compliant out-of-plane (i.e., the z axis direction) when the leads 82A and 82B are disposed, onto or adjacent, the pillars 76A and 76B and the polymer layers 75A and 75B. Examples of material that the polymer layers 75A and 75B can be fabricated from include, for example, polyimides, polynorbornenes, epoxides, polyarylenes ethers, and parylenes. In particular, the polymer layers 75A and 75B can include materials such as Amoco Ultradel™ 7501, BF Goodrich Avatrel™ Dielectric Polymer, DuPont™ 2611, DuPont™ 2734, DuPont™

2771, and DuPont™ 2555. Thus, by making the base of the pillars 76A and 76B very compliant, the pillars 76A and 76B can be made out of other materials. Moreover, compliant structures may be fabricated below the pillars 76A and 76B and can enhance compliancy in all axes.

The polymer layer height is about 10 micrometers to about 300 micrometers, and the radius is about 2 micrometers to about 100 micrometers. Preferably, the polymer layer height is about 30 micrometers to about 150 micrometers, and the radius is about 5 micrometers to about 10 micrometers. The polymer layers 75A and 75B can be deposited onto the substrate 72 using techniques such as, for example, spin-coating, doctor-blading, sputtering, lamination, screen or stencil-printing, chemical vapor deposition (CVD), or plasma based deposition. These films could be made from porous polymers, or materials with a very high degree of elasticity, to allow the leads greater deflection in the z-axis. The importance of these polymer layers 75A and 75B is to allow the pillar greater compliance in all directions.

The pillars 76A and 76B are made of low modulus materials as described above in reference to FIG. 1. The pillars 76A and 76B depicted in FIG. 4 are rectangular three-dimensional structures, however, the three-dimensional structures of the pillars are not limited to these structures and can include the three-dimensional structures described in reference to FIG. 1. As indicated above, the type, size, and shape of the three-dimensional structure determines the compliancy of the lead. Therefore, the amount of compliance can, in part, be controlled by selecting the type, size, and shape of the three-dimensional structure.

The pillars 76A and 76B can have a height from about 10 to about 300 micrometers, width of about 2 to about 100 micrometers, and length of about 2 to about 100 micrometers. Preferably, the pillars 76A and 76B can have a height from about 30 to about 150 micrometers, width of about 5 to about 10 micrometers, and length of about 5 to about 10 micrometers.

The leads 82A and 82B can be fabricated of any single layer or layers of different metals, metal composites, or organic conductors appropriate for the compliant wafer device 70. The metals and metal composites include, but are not limited to, gold, gold alloys, copper, and copper alloys. The leads 82A and 82B can be fabricated by monolithically electroplating the selected metal or metal composite onto the compliant wafer device 70.

The leads 82A and 82B can have a thickness that ranges from about 1 to about 100 micrometers, and preferably from about 0.5 to about 10 micrometers. The preferred embodiment of the leads 82A and 82B has a thickness of about 2 micrometers. The leads 82A and 82B can have lengths that range from about 2 and about 300 micrometers, and preferably from about 30 to about 150 micrometers. The leads 82A and 82B can have a width that ranges from about 1 to about 100 micrometers, and preferably from about 2 to about 40 micrometers. The leads 82A and 82B can have a height that ranges from about 10 to about 300 micrometers, and preferably from about 30 to about 150 micrometers.

For the purposes of illustration only, and without limitation, embodiments of the present invention will be described with particular reference to the below-described fabrication methods. Note that not every step in the process is described with reference to the process described in the figures hereinafter. For example, photolithography, or similar techniques, can be used to define the lead pattern. In this regard, the pattern can be defined by depositing sacrificial material (e.g., photoresist) using techniques such as, for example, spin-coating, doctor-blading, or plasma based deposition. Furthermore, the pattern can then be exposed to light and developed. Therefore, the following fabrication process is not intended to be an exhaustive list that includes every step required to fabricate the embodiments of the compliant wafer devices.

Figure 5A:
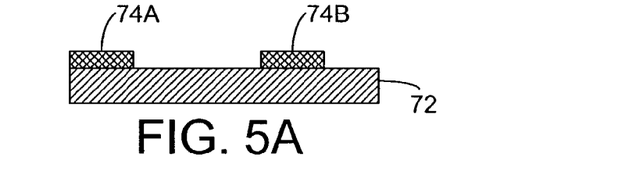
FIGS. 5A through 5H are cross-sectional views that illustrate a representative process of fabricating the compliant wafer-level package shown in FIG. 4.
Figure 5B:
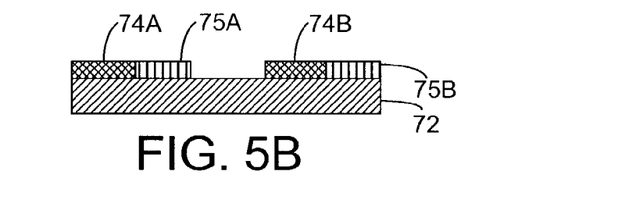

FIGS. 5A through 5H are cross-sectional views that illustrate a representative process for fabricating the lead packages 71A and 71B for the compliant wafer device 70 illustrated in FIG. 4. FIG. 5A illustrates the substrate 72 having the die pads 74A and 74B disposed upon the substrate 72. FIG. 5B illustrates the polymer layers 75A and 75B disposed upon the substrate 72.

Figure 5C:
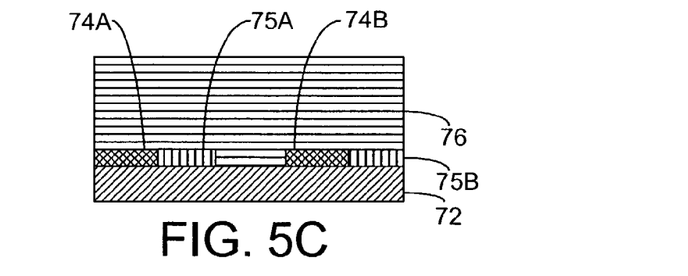

FIG. 5C illustrates the highly compliant material layer 76 disposed upon the substrate 72, two die pads 74A and 74B, and the polymer layers 75A and 75B. The low modulus material can be deposited on the substrate 72, the die pads 74A and 74B, and the polymer layers 75A and 75B by methods such as, for example, spin-coating, doctor-blading, and plasma deposition.

Figure 5D:
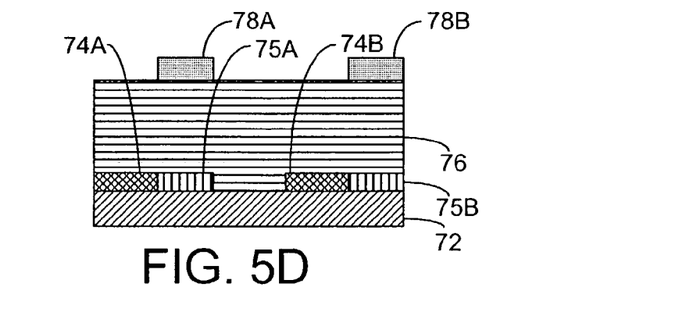
Figure 5E:
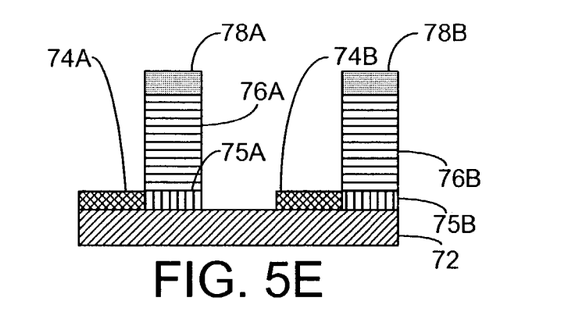

FIG. 5D illustrates the addition of the mask 78A and 78B disposed on the modulus material layer 76, but not directly over the die pads 74A and 74B. The mask 78A and 78B can be made of material such as, but not limited to, any material that is selective to polymer etching, such as metals and silicone dioxide. This mask is not needed, however, when the pillars are fabricated by photo-definition FIG. 5E illustrates the etching of the modulus material layer 76, which forms the pillars 76A and 76B. The modulus material layer 76 can also be formed using techniques such as, for example, RIE, photo-definition, and laser drilling.

Figure 5F:
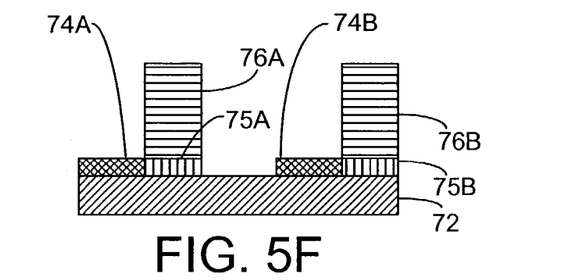
Figure 5G:
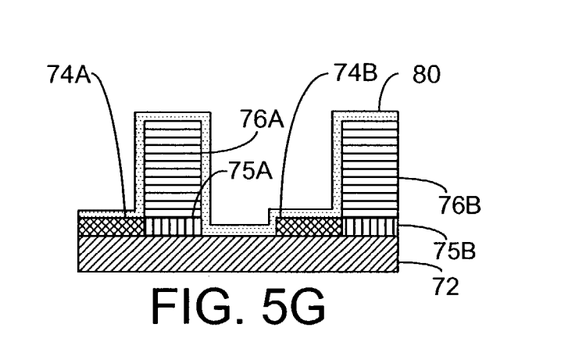

FIG. 5F illustrates the removal of the mask 78A and 78B. FIG. 5G illustrates the disposition of the seed layer 80 onto the die pads 74A and 74B and the pillars 16A and 16B. The seed layer 80 can be deposited using techniques such as, for example, sputtering, evaporating, electron-beam deposition, and electroless plating. The seed layer 80 is needed when the leads are meant to be electroplated. If no electroplating is required, then the just deposited metal can be patterned in a subtractive process to yield the leads.

Figure 5H:
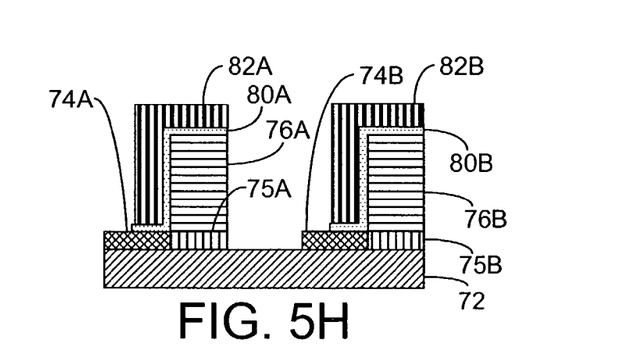

FIG. 5H illustrates the deposition of the leads 82A and 82B onto the seed layers 80A and 80B after the seed layer 80 has been etched. The leads 82A and 82B can be deposited by the techniques referred to above. It should be noted that to simplify FIG. 4, the seed layers 80A and 80B are not shown.

Figure 6A:
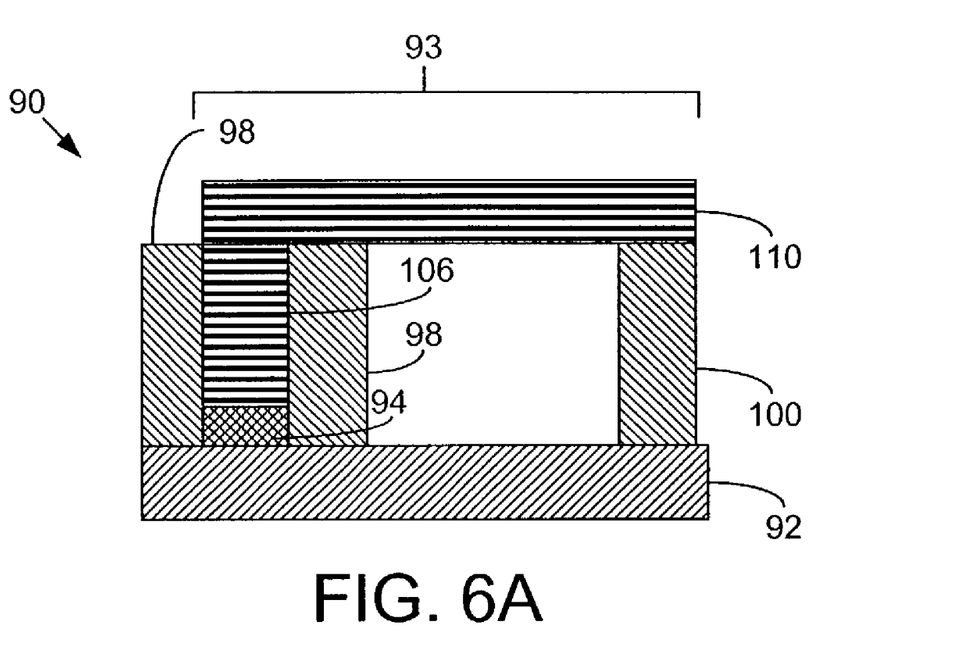
Figure 6B:
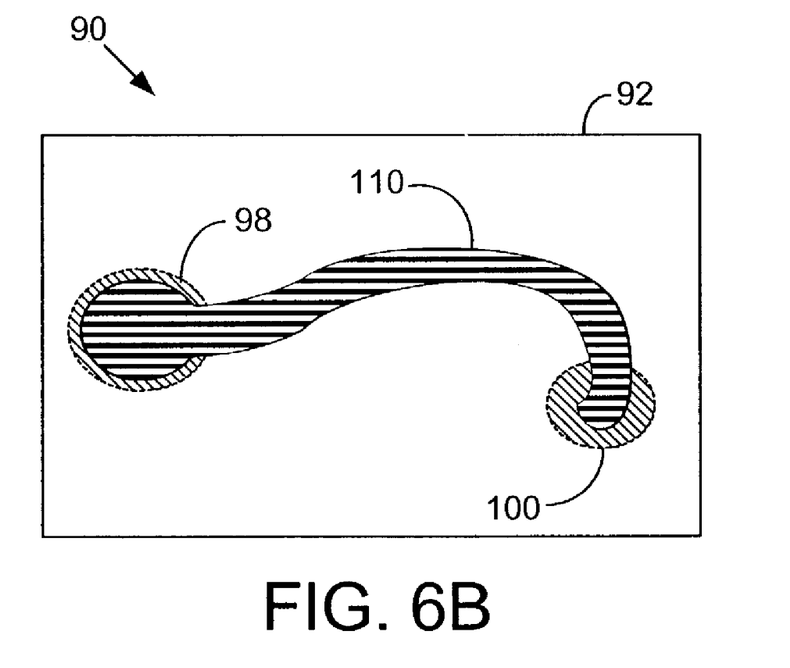
FIG. 6B is a top view of the compliant wafer-level package in FIG. 6A.

FIG. 6A is a cross-sectional view of the compliant wafer 90, while FIG. 6B is a top-view of the compliant wafer 90 illustrated in FIG. 6A. FIG. 6A illustrates the compliant wafer 90 that includes the substrate 92 having the die pad 94 disposed thereon. The substrate 92 and the die pad 94 are similar to the substrate 12 and the die pads 14A and 14B described in reference to FIG. 1.

The lead 93 is disposed on the die pad 94. The lead 93 includes a lead post 106 having a first end disposed on the die pad 94 and a second end attaching to a lead arm 110. The lead arm 110 has a first end attaching to the lead post 106 and a second end extending from the lead post 106. Adjacent the lead post 106 is a first pillar 98 (i.e., doughnut shaped) made of a low modulus material that substantially surrounds the lead post 106 and supports the first end of the lead arm 110. A second pillar 100 made of a low modulus material supports the second end of the lead arm 110 such that a space exists between the first and second pillars 98 and 100. FIG. 6B illustrates a top view of the first and second pillars 98 and 100 supporting the lead 93.

The lead geometry is not limited to that shown in FIG. 6B. Instead, various lead geometries can provide compliance, consistent with the scope of the present invention. Additional steps can be performed to fabricate an attachment or contact (not shown) on the end portion of the lead arm 110. This contact can include a variety of items designed to contact or attach to a pad or point on another substrate. These contacts can be, for example, a solder bump, a conductive adhesive, a filled polymer, or a contact probe. The contacts can be formed with methods such as electroplating, electroless plating, screen or stencil printing.

The first and second pillars 98 and 100 are made of low modulus materials such as, but not limited to, polyimides, epoxides, polynorbornenes, polyarylene ethers, and parylenes. In particular, the low modulus materials can include materials such as Amoco Ultradel™ 7501, BF Goodrich Avatrel™ Dielectric Polymer, DuPont™ 2611, DuPont™ 2734, DuPont™ 2771, and DuPont™ 2555. The first and second pillars 98 and 100 can be made of the same or different low modulus materials.

The first and second pillars 98 and 100 depicted in FIGS. 6A and 6B are rectangular three-dimensional structures, however, the three-dimensional shapes of the pillars are not limited to these shapes. For example, the three-dimensional shapes illustrated in FIGS. 2A and 2B, as well as the other three-dimensional shapes discussed above, can be used with the compliant wafer device 90. As indicated above, the type, size, and shape of the three-dimensional structure determines the compliancy of the lead. Therefore, the amount of compliance can, in part, be controlled by selecting the type, size, and shape of the three-dimensional structure.

The first and second pillars 98 and 100 can have a height from about 10 to about 300 micrometers, width of about 10 to about 100 micrometers, and length of about 5 to about 50 micrometers. Preferably, the first and second pillars 98 and 100 can have a height from about 30 to about 100 micrometers, width of about 10 to about 50 micrometers, and length of about 5 to about 10 micrometers.

The lead 93 can be fabricated of any single layer or layers of different metals, metal composites, or organic conductors appropriate for the compliant wafer device 90. The metals and metal composites include, but are not limited to, gold, gold alloys, copper, and copper alloys. The lead 93 can be fabricated by monolithically electroplating the selected metal or metal composite onto the compliant wafer device.

The lead 93 can have a thickness that ranges from about 1 to about 100 micrometers, and preferably from about 2 to about 20 micrometers. The preferred embodiment of the lead 93 can have a thickness of about 10 micrometers. The lead 93 can have a length that ranges from about 30 to about 400 micrometers and preferably from about 40 to about 200 micrometers. The lead 93 can have widths that range from about 1 to about 100 micrometers, and preferably from about 5 to about 50 micrometers. The preferred embodiment of the lead 93 has a width in the range of about 10 to about 40 micrometers. The lead 93 can have a height that ranges from about 1 to about 100 micrometers, and preferably from about 2 to about 40 micrometers. The preferred embodiment of the lead 93 has a height in the range of about 2 to about 10 micrometers.

For the purposes of illustration only, and without limitation, embodiments of the present invention will be described with particular reference to the below-described fabrication methods. Note that not every step in the process is described with reference to the process described in the figures hereinafter. For example, photolithography, or similar techniques, can be used to define the lead pattern. In this regard, the pattern can be defined by depositing sacrificial material (e.g., photoresist) using techniques such as, for example, for example, spin-coating, doctor-blading, or plasma based deposition. Furthermore, the pattern can then be exposed to light and developed. Therefore, the following fabrication processes is not intended to be an exhaustive list that includes every step required to fabricate the embodiments of the compliant wafer devices.

Figure 7A:
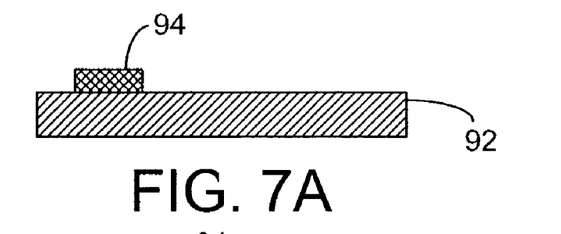
FIGS. 7A through 7H are cross-sectional views that illustrate a representative process of fabricating another embodiment of the compliant wafer-level package as shown in FIGS. 6A and 6B.
Figure 7B:
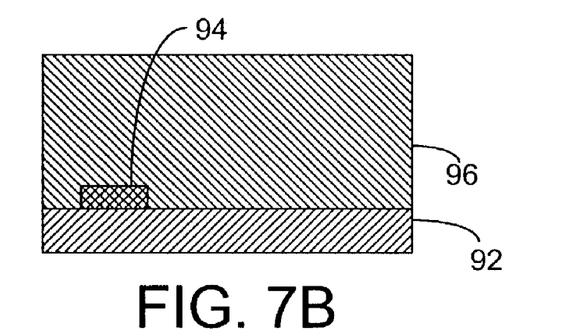

FIGS. 7A through 7G are cross-sectional views that illustrate a representative process for fabricating the lead package 93 for the compliant wafer device 90 illustrated in FIGS. 6A and 6B. FIG. 7A illustrates the substrate 92 having the die pad 94 disposed upon the substrate 92. FIG. 7B illustrates the low modulus material layer 96 disposed upon the substrate 92 and the die pad 94. The low modulus material 96 can be deposited on the substrate 92 and the die pad 94 by methods such as, for example, spin-coating, doctor-bladeing, and plasma deposition.

Figure 7C:
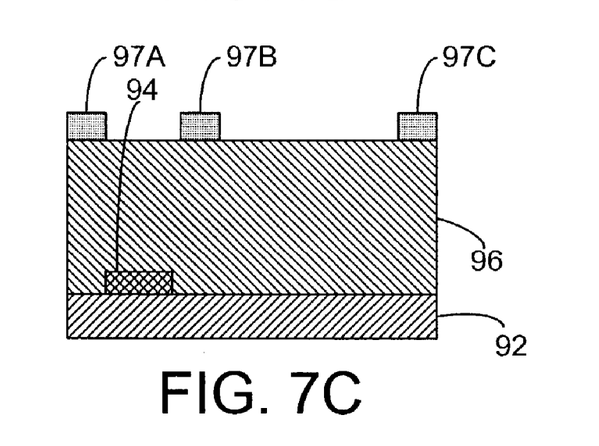

FIG. 7C illustrates the addition of the hard mask 97A, 97B, and 97C disposed on the modulus material layer 96, but not directly over the die pad 94. The mask 97A, 97B, and 97C can be made of materials such as, but not limited to, any material that is selective to polymer etching such as metals and silicone dioxide. A hard mask is not necessary if the pillars are photodefined.

Figure 7D:
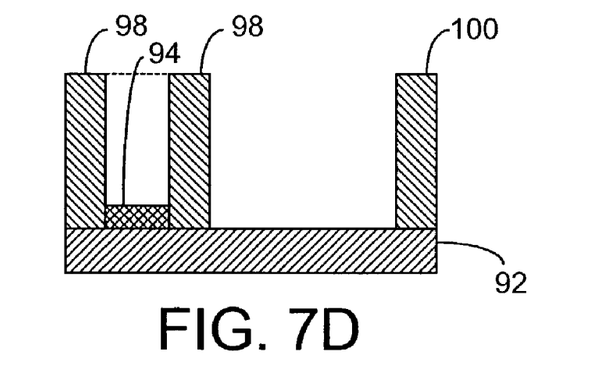

FIG. 7D illustrates the etching of the modulus material layer 96, which forms the first pillar 98 and the second pillar 100, and the removal of the mask 97A, 97B, and 97C. The first pillar 98 is circular, however, the backside of the first pillar is shown as a dashed line to show the hollow portion of the first pillar 98. The first and second pillars 98 and 100 can also be formed using techniques such as, for example, RIE, photo-definition, and laser drilling.

Figure 7E:
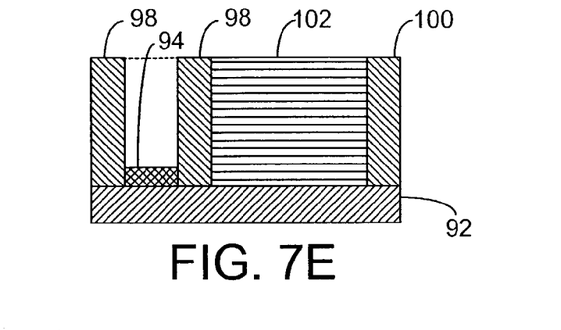

FIG. 7E illustrates the sacrificial material 102 disposed in an area substantially between the first and second pillars 98 and 100. The sacrificial layer 102 can be virtually any material (e.g., polymer) that has a decomposition temperature less than the decomposition or degradation temperature of the low modulus materials used to fabricate the first and second pillars 98 and 100 or a polymer material, such as resist, that can be dissolved away with a selective material/solvent.

Examples of materials that can be used as the sacrificial layer 102 include, but are not limited to, compounds such as polynorbornenes, polyoxymethylene, polycarbonates, polyethers, and polyesters. In particular, the sacrificial layer may include compounds, such as, for example, BF Goodrich Unity™ 200, polypropylene carbonate, polyethylene carbonate, polyhexene carbonate, and polynorborene carbonate. The sacrificial layer 102 may also contain photosensitive compounds, which are additives for patterning or decomposition. The addition of a second component to the sacrificial polymer can deter its decomposition temperature.

The sacrificial layer 102 can be deposited onto the substrate 92 using techniques such as, for example, spin-coating, doctor-blading, sputtering, lamination, screen or stencil-printing, melt dispensing, chemical vapor deposition (CVD), and plasma based deposition systems.

Figure 7F:
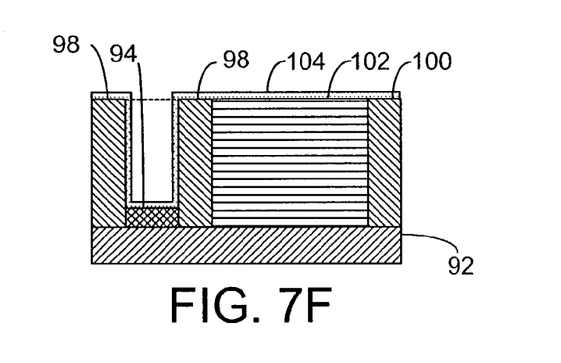

FIG. 7F illustrates the disposition of the seed layer 104 onto a portion of the die pad 94, the first and second pillars 98 and 100, and the sacrificial layer 102. The seed layer 104 can be deposited using techniques such as, for example, sputtering, evaporating, electron-beam deposition, and electroless plating.

Figure 7G:
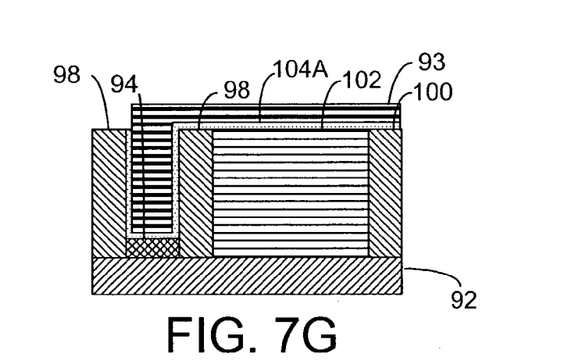
Figure 7H:
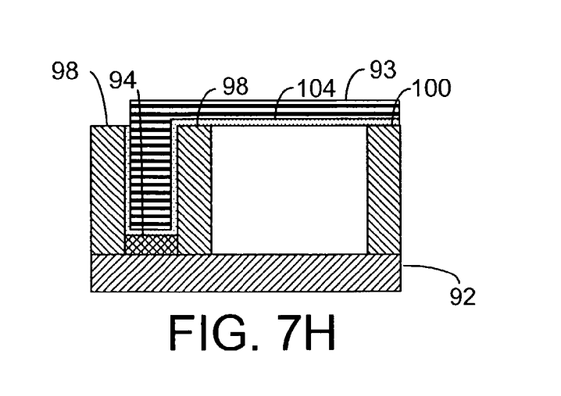

FIG. 7G illustrates the deposition of the lead 93 onto the seed layer 104A after the seed layer 104 has been etched. The lead 93 can be deposited by the techniques referred to above. It should be noted that to simplify FIGS. 6A and 6B, the seed layers are not shown. FIG. 7H illustrates the removal of the sacrificial layer 102 to form a compliant wafer.

Each of the processes illustrated in FIGS. 3A–3G, 5A–5H, and 7A–7H may be performed in a different sequence. Therefore, variations known to one skilled in the art of the fabrication processes described are included herein.

FIGS. 1, 2A–2B, 3A–3G, 4, 5A–5H, 6A–6B, and 7A–7H illustrated the compliant wafers 10, 30, 50, 70 and 90 as having only one or two lead packages, which was done to more clearly describe the compliant wafers 10, 30, 50, 70 and 90 and their corresponding fabrication processes. However, many lead packages can be disposed upon a compliant wafer device, as described above.

The fabrication processes illustrated in FIGS. 3A–3G, 5A–5H and 7A–7H are very low cost wafer-level packaging processes. These processes use parallel processing in which all dice on a compliant wafer are packaged and tested simultaneously. By contrast, conventional packaging is a serial process in which a wafer is sawed up and the individual dice are individually packaged and tested. As a result, the processes of the present invention offer substantial time and cost savings.

The electrical performance of the compliant wafers 10, 30, 50, 70 and 90 is high from direct current to microwave frequencies. Due to the short lead length, the inductance, resistance, and capacitance are minimal. As a result, the package leads can preserve signal integrity and minimize ground bounce, cross talk, resistive losses, and heat generation. Some of the benefits of the compliant wafers 10, 30, 50, 70 and 90 having ultra high I/O density include enhancing the chip's power wiring distribution, increasing in input/output bandwidth, satisfying three-dimensional structure I/O demands, suppression of simultaneous switching noise, and improving isolation in mixed signal systems as well as enhancing chip testing due to the ability to gain access to a greater number of internal chip nodes/cells. In addition, the compliant wafers 10, 30, 50, 70 and 90 can be attached to a board with a much higher coefficient of thermal expansion without underfill because the leads are flexible in-plane and out-of-plane. Additionally, not only does this reduce the cost of assembly, but it also enhances reliability. This compliant package can be integrated with optical and RF interconnects as well as micro-electro mechanical devices. Furthermore, the simplification of the chip testing procedure substantially reduces testing time and cost.

It should be emphasized that the above-described embodiments of the present invention, particularly, any "preferred" embodiments, are merely possible examples of implementations, merely set forth for a clear understanding of the principles of the invention. For example, the pillars can be fabricated of multiple low modulus materials. Another example includes forming the pillars of a sacrificial polymer, so that the pillars can be removed after fabricating the leads. One last example includes forming a solid pillar (the pillar 106 is fabricated to be hollow) and etching out the middle portion to make it hollow (i.e., form a via). Thereafter, a metal lead can be fabricated in the hollowed-out portion of the pillar. Therefore, many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, the following is claimed:

1. A device having a compliant wafer-level package, comprising:
   a substrate having a die pad disposed thereon;
   a lead attached to the die pad, wherein the lead includes a lead post having a first end disposed on the die pad and a second end attatbing to a lead arm, wherein the lead arm has a first end attaching to the lead post and a second end extending from the lead post;
   a first pillar having a first low modulus polymer material substantially disposed around the lead post and between the lead arm and the substrate; and
   a second pillar having a second low modulus polymer material disposed between the second end of the lead arm and the substrate supporting the lead arm, wherein a space exists between the first pillar and the second pillar.

2. The device of claim 1, including about 10 leads to about 100,000 leads per centimeter squared.

3. The device of claim 1, including about 10,000 to about 20,000 pairs of first and second pillars per centimeter squared.

4. The device of claim 1, wherein the first low modulus polymer material and the second low modulus polymer material includes compounds selected from polyimides, epoxides, polynorbornenes, polyarylene ethers, and parylenes.

5. The device of claim 1, wherein the first pillar has a height of about 10 micrometers to about 300 micrometers, a width of about 2 micrometers to about 100 micrometers, and a length of about 2 micrometers to about 100 micrometers.

6. The device of claim 1, wherein the second pillar has a height of about 10 micrometers to about 300 micrometers, a width of about 2 micrometers to about 100 micrometers, and a length of about 2 micrometers to about 100 micrometers.

* * * * *

UNITED STATES PATENT AND TRADEMARK OFFICE
CERTIFICATE OF CORRECTION

PATENT NO.        : 7,132,736 B2
APPLICATION NO. : 10/285034
DATED             : November 7, 2006
INVENTOR(S)       : Bakir et al.

It is certified that error appears in the above-identified patent and that said Letters Patent is hereby corrected as shown below:

IN THE CLAIMS
Col. 12, line 23, delete "attatbing" and replace with --attaching--.

Signed and Sealed this

Twenty-third Day of January, 2007

JON W. DUDAS
*Director of the United States Patent and Trademark Office*